(12) United States Patent
Yeh et al.

(10) Patent No.: US 8,762,116 B2
(45) Date of Patent: Jun. 24, 2014

(54) VEHICLE MOTOR TEMPERATURE DETERMINATION

(75) Inventors: Chia-Chou Yeh, Gardena, CA (US);
Steven E. Schulz, Torrance, CA (US);
Daniel J. Berry, Macomb Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 182 days.

(21) Appl. No.: 13/090,990

(22) Filed: Apr. 20, 2011

(65) Prior Publication Data

US 2012/0271606 A1  Oct. 25, 2012

(51) Int. Cl.
*G06G 7/48* (2006.01)
*G06F 17/50* (2006.01)

(52) U.S. Cl.
CPC .................... *G06F 17/5018* (2013.01)
USPC ............................................. 703/8

(58) Field of Classification Search
USPC ........................................ 703/7–8
See application file for complete search history.

(56) References Cited

U.S. PATENT DOCUMENTS

| | | | | |
|---|---|---|---|---|
| 6,076,964 | A * | 6/2000 | Wu et al. ...................... | 374/141 |
| 7,615,951 | B2 * | 11/2009 | Son et al. ...................... | 318/432 |
| 8,229,629 | B2 * | 7/2012 | Limpibunterng et al. ...... | 701/41 |
| 2003/0180583 | A1 * | 9/2003 | Ichikawa et al. ................ | 429/9 |
| 2008/0196962 | A1 * | 8/2008 | Capito .......................... | 180/249 |

FOREIGN PATENT DOCUMENTS

JP   8284734   * 10/1996

OTHER PUBLICATIONS

Briz F., et al. "Temperature Estimation in Inverter-Fed Machines Using High-Frequency Carrier Signal Injection," IEEE Transactions on Industry Applications, vol. 44, No. 3; May/Jun. 2008. pp. 799-808.
Lee, Sang-Bin, et al. "An Evaluation of Model-Based Stator Resistance Estimation for Induction Motor Stator Winding Temperature Monitoring," IEEE Transactions on Energy Conservation, vol. 17, No. 1, Mar. 2002. pp. 7-15.

* cited by examiner

*Primary Examiner* — Eunhee Kim
(74) *Attorney, Agent, or Firm* — Ingrassia Fisher & Lorenz, P.C.

(57) ABSTRACT

Methods and systems are provided for determining a temperature of a motor of a vehicle having an ignition when the ignition is turned on following a period of time in which the ignition had been turned off. An amount of time for which the vehicle had been turned off is determined. A motor temperature model is run using a time step to simulate the amount of time for which the vehicle had been turned off to determine an initial value of the temperature of the motor.

20 Claims, 4 Drawing Sheets

VEHICLE MOTOR TEMPERATURE DETERMINATION

TECHNICAL FIELD

The present disclosure generally relates to the field of vehicles and, more specifically, to methods and systems for determining a temperature of a motor of a vehicle.

BACKGROUND

Automobiles and various other vehicles depend on motor operation. During operation of the vehicle, various vehicle systems may utilize an estimated motor temperature for use in controlling operation of the vehicle systems. Certain techniques utilize a motor coolant temperature to approximate the motor temperature, for example when an ignition of the vehicle has recently been started. However, the motor coolant temperature may not always provide an optimal estimate for the motor temperature, for example if the ignition had been turned off for only a relatively short period of time before being turned back on and/or if the weather is relatively warm outside the vehicle.

Accordingly, it is desirable to provide improved methods for determining a motor temperature of a vehicle, for example for an initial estimate of the motor temperature after the ignition has been turned on. It is also desirable to provide improved program products and systems for such estimation of a motor temperature of a vehicle. Furthermore, other desirable features and characteristics of the present invention will be apparent from the subsequent detailed description and the appended claims, taken in conjunction with the accompanying drawings and the foregoing technical field and background.

SUMMARY

In accordance with an exemplary embodiment, a method for determining a temperature of a motor of a vehicle having an ignition when the ignition is turned on following a period of time in which the ignition had been turned off is provided. The method comprises the steps of determining an amount of time for which the vehicle had been turned off, and running a motor temperature model using a time step to simulate the amount of time for which the vehicle had been turned off to determine an initial value of the temperature of the motor.

In accordance with another exemplary embodiment, a program product for determining a temperature of a motor of a vehicle having an ignition when the ignition is turned on following a period of time in which the ignition had been turned off is provided. The program product comprises a program and a non-transitory, computer readable storage medium. The program is configured to determine an amount of time for which the vehicle had been turned off, and run a motor temperature model using a time step to simulate the amount of time for which the vehicle had been turned off to determine an initial value of the temperature of the motor. The non-transitory, computer readable storage medium stores the program.

In accordance with a further exemplary embodiment, a system for determining a temperature of a motor of a vehicle having an ignition when the ignition is turned on following a period of time in which the ignition had been turned off is provided. The system comprises a memory and a processor. The memory is configured to store an input. The processor is coupled to the memory. The processor is configured to determine an amount of time for which the vehicle had been turned off, and run a motor temperature model using the input and using a time step to simulate the amount of time for which the vehicle had been turned off to determine an initial value of the temperature of the motor.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the disclosure or the application and uses thereof. Furthermore, there is no intention to be bound by any theory presented in the preceding background or the following detailed description.

Figure 1:
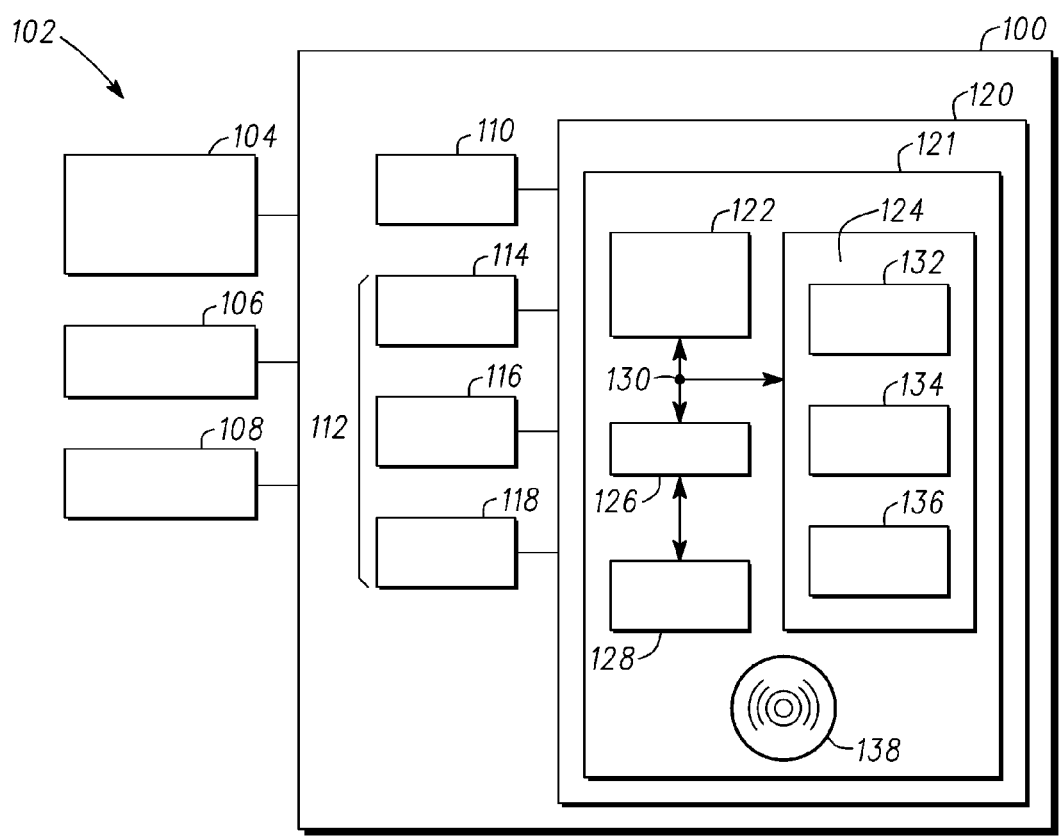
FIG. 1 is a functional block diagram of a system for determining a motor temperature, for example for a vehicle such as an automobile, in accordance with an exemplary embodiment.

FIG. 1 is a functional block diagram of a system 100. The system 100 is configured to determine a temperature of a motor 104 of a vehicle. In certain embodiments, the vehicle comprises an automobile, such as a sedan, a sport utility vehicle, a van, or a truck. However, the system 100 may also be used in various other types of vehicles. The motor 104 is depicted in FIG. 1 as being part of a motor system 102. The motor 104 is cooled by a motor coolant 106 (for example, transmission fluid) as part of the motor system 102. In addition, an ignition 108 of the vehicle is turned on and off (for example by a driver turning an ignition key on and off), also preferably as part of the motor system 102.

The system 100 includes a timer 110, sensors 112, and a controller 120. The timer 110 determines an amount of time during which the ignition 108 is turned off before the engine is turned on again in a current iteration. Specifically, the timer 110 preferably determines an amount of time beginning when the ignition 108 is keyed off (or turned off) and ending when the ignition 108 is keyed back on again (or turned on). The timer 110 provides the amount of time and/or information pertaining thereto to the controller 120 for processing and for use in determining temperature values for the motor 104.

The sensors 112 include an ambient temperature sensor 114, a motor coolant temperature sensor 116, and an ignition sensor 118. The ambient temperature sensor 114 measures an ambient temperature surrounding the vehicle, and provides these measurements and/or information pertaining thereto to the controller 120 for processing and for use in determining temperature values for the motor 104. The motor coolant temperature sensor 116 measures a temperature of the motor coolant 106 and provides these measurements and/or information pertaining thereto to the controller 120 for processing and for use in determining temperature values for the motor 104. The ignition sensor 118 senses whether the ignition 108 is turned on or off and provides signals and/or information pertaining thereto to the controller 120 for processing and for use in determining temperature values for the motor 104.

The controller 120 is coupled to the timer 110, the ambient temperature sensor 114, the motor coolant temperature sensor 116, and the ignition sensor 118. The controller 120 receives the signals as to whether the ignition 108 of the vehicle is turned on or off from the ignition sensor 118, and also receives values as to an amount of time that the ignition 108 has been turned off from the timer 110. In addition, the controller 120 receives the values of the ambient temperature from the ambient temperature sensor 114 and the motor coolant temperature from the motor coolant temperature sensor 116, respectively. The controller 120 processes these various signals and values in determining temperatures of the motor 104. In so doing, the controller 120 utilizes a motor temperature model using different step values and inputs, preferably in executing the steps of the processes 200, 300 described further below in connection with FIGS. 2 and 3.

As depicted in FIG. 1, the controller 120 comprises a computer system 121. In certain embodiments, the controller 120 may also include one or more of the timer 110, sensors 112, and/or one or more other devices. In addition, it will be appreciated that the controller 120 may otherwise differ from the embodiment depicted in FIG. 1, for example in that the controller 120 may be coupled to or may otherwise utilize one or more remote computer systems and/or other control systems.

In the depicted embodiment, the computer system 121 is coupled to the timer 110 and each of the sensors 112. The computer system 121 includes a processor 122, a memory 124, an interface 126, a storage device 128, and a bus 130. The processor 122 performs the computation and control functions of the computer system 121 and the controller 120, and may comprise any type of processor or multiple processors, single integrated circuits such as a microprocessor, or any suitable number of integrated circuit devices and/or circuit boards working in cooperation to accomplish the functions of a processing unit. During operation, the processor 122 executes one or more programs 132 contained within the memory 124 and, as such, controls the general operation of the controller 120 and the computer system 121, preferably in executing the steps of the processes 200, 300 described further below in connection with FIGS. 2 and 3.

The memory 124 can be any type of suitable memory, including, for example, various types of dynamic random access memory (DRAM) such as SDRAM, the various types of static RAM (SRAM), and the various types of non-volatile memory (PROM, EPROM, and flash). The bus 130 serves to transmit programs, data, status and other information or signals between the various components of the computer system 121. In a preferred embodiment, the memory 124 stores the above-referenced program 132 along with one or more stored values 134 and a motor temperature model 136. In certain examples, the memory 124 is located on and/or co-located on the same computer chip as the processor 122.

The interface 126 allows communication to the computer system 121, for example from a system driver and/or another computer system, and can be implemented using any suitable method and apparatus. It can include one or more network interfaces to communicate with other systems or components. The interface 126 may also include one or more network interfaces to communicate with technicians, and/or one or more storage interfaces to connect to storage apparatuses, such as the storage device 128.

The storage device 128 can be any suitable type of storage apparatus, including direct access storage devices such as hard disk drives, flash systems, floppy disk drives and optical disk drives. In one exemplary embodiment, the storage device 128 comprises a program product from which memory 124 can receive a program 132 that executes one or more embodiments of one or more processes of the present disclosure, such as the steps of the processes 200, 300 described further below in connection with FIGS. 2 and 3. In another exemplary embodiment, the program product may be directly stored in and/or otherwise accessed by the memory 124 and/or a disk (e.g. disk 138), such as that referenced below.

The bus 130 can be any suitable physical or logical means of connecting computer systems and components. This includes, but is not limited to, direct hard-wired connections, fiber optics, infrared and wireless bus technologies. During operation, the program 132 is stored in the memory 124 and executed by the processor 122.

It will be appreciated that while this exemplary embodiment is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium bearing the program and containing computer instructions stored therein for causing a computer processor (such as the processor 122) to perform and execute the program. Such a program product may take a variety of forms, and the present disclosure applies equally regardless of the particular type of computer-readable signal bearing media used to carry out the distribution. Examples of signal bearing media include: recordable media such as floppy disks, hard drives, memory cards and optical disks, and transmission media such as digital and analog communication links. It will similarly be appreciated that the computer system 121 may also otherwise differ from the embodiment depicted in FIG. 1, for example in that the computer system 121 may be coupled to or may otherwise utilize one or more remote computer systems and/or other control systems.

Figure 2:
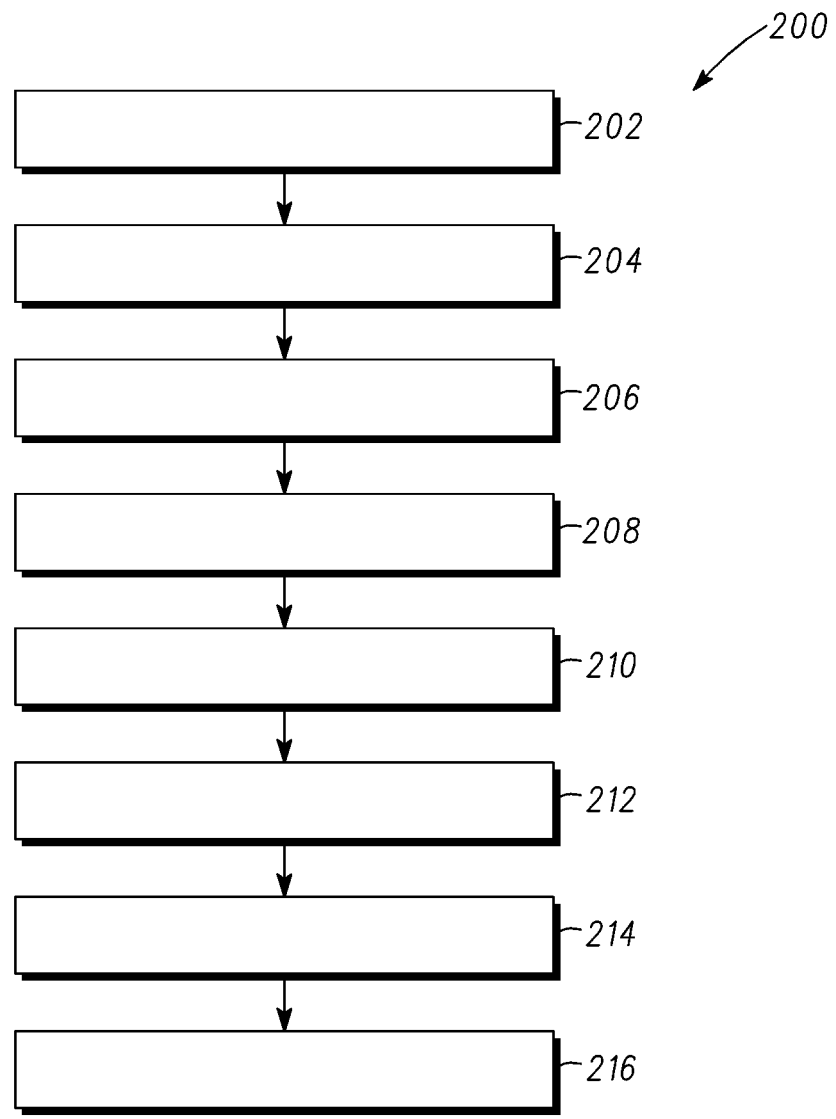
FIG. 2 is a flowchart of a process for determining a motor temperature of a vehicle, and that can be used in connection with the system of FIG. 1, in accordance with an exemplary embodiment.

FIG. 2 is a flowchart of a process 200 for determining a motor temperature of a vehicle, in accordance with an exemplary embodiment. The process 200 utilizes a motor temperature model with different time steps in order to generate initial motor temperature condition determinations. The different time steps are based on an amount of time that an ignition of the vehicle has been turned off. The initial motor temperature condition determinations are then used in the motor temperature model to generate subsequent motor temperature values, as described below. The process 200 can preferably be utilized in connection with the systems 100 and 102 of FIG. 1 in accordance with an exemplary embodiment.

As depicted in FIG. 2, the process 200 includes the step of determining that the ignition of the vehicle has been turned off (step 202). This determination preferably comprises a determination as to whether the ignition 108 of FIG. 1 is in an "off" state, for example when a driver of the vehicle turns the ignition key to an off position and the ignition is in an off or substantially inactive state. This determination is preferably made by the controller 120 of FIG. 1, most preferably the processor 122 thereof, based on information provided thereto by the ignition sensor 118 of FIG. 1.

Once the ignition is determined to be off, motor temperature values are stored for future use (step 204). Preferably, each motor temperature value comprises a temperature of the motor 104 of FIG. 1 at a particular node of the motor as determined by a most recent iteration of a motor temperature model (such as the motor temperature model 136 stored in the memory 124 of FIG. 1, and described further below in connection with FIGS. 3 and 4) at the time in which the ignition 108 of FIG. 1 is turned off. In one exemplary embodiment, the motor temperature values are calculated continuously using the motor temperature model while the ignition is on, and the motor temperature values stored in step 204 comprise most recent values of the motor temperature values while the ignition was on and shortly before the ignition was turned off. The motor temperature values of step 204 are preferably stored in the memory 124 of FIG. 1 as stored values 134 of FIG. 1 by the processor 122 of FIG. 1 for use in determining initial motor temperature conditions the next time that the ignition 108 of FIG. 1 is turned back on.

A timer is run while the ignition is turned off (step 206). Preferably, the processor 122 controls the timer 110 to run once the ignition 108 is turned off and to continue to run until the ignition 108 of FIG. 1 is turned back on again. Once it is determined that the ignition is turned back on again (step 208), a determination is made as to how much time had elapsed while the ignition was off (step 210). The determination of step 210 is preferably made by the controller 120, most preferably by the processor 122 thereof, based on signals or other information provided thereto by the timer 110.

In addition, an ambient temperature is obtained (step 212). The ambient temperature preferably comprises an air temperature of ambient air surrounding the vehicle. The ambient temperature is preferably measured by the ambient temperature sensor 114 of FIG. 1, and signals or other information pertaining thereto are provided to the controller 120, most preferably the processor 122 thereof, for processing.

A motor temperature model is then run for a first sequence of iterations (step 214). Specifically, the motor temperature model 136 of FIG. 1 stored in the memory 124 is preferably retrieved and executed by the processor 122 to generate initial motor temperature values. In the first sequence of iterations of the motor temperature model, a time step is utilized in order to simulate the amount of time from step 210 in which the ignition was turned off. The magnitude of the time step is positively related to the amount of time from step 210, so that the time step increases for a relatively larger amount of time from step 210. In addition, various inputs for the motor temperature model for the first sequence of iterations include the prior temperature value of step 204 as well as the ambient temperature of step 212.

The motor temperature model is then run for an additional sequence of iterations (step 216). In the additional sequence of iterations of the motor temperature model, a different time step is utilized. The time step for the additional sequence of iterations of step 216 is preferably smaller than the time step used for the first sequence of iterations of step 214. The time step for the first sequence of iteration may be as large as, but not limited to, five seconds (5 sec), while the time step for the second sequence of iteration is approximately 12.5 milliseconds (msec) in one exemplary embodiment. However, this may vary in other embodiments. The initial motor temperature values generated from step 214 are used as inputs for the motor temperature model in step 216, to thereby generate subsequent motor temperature values for the various nodes of the motor. The subsequent motor temperatures can then be utilized in controlling the motor and/or in controlling one or more other vehicle systems and/or devices of the vehicle.

Figure 3:
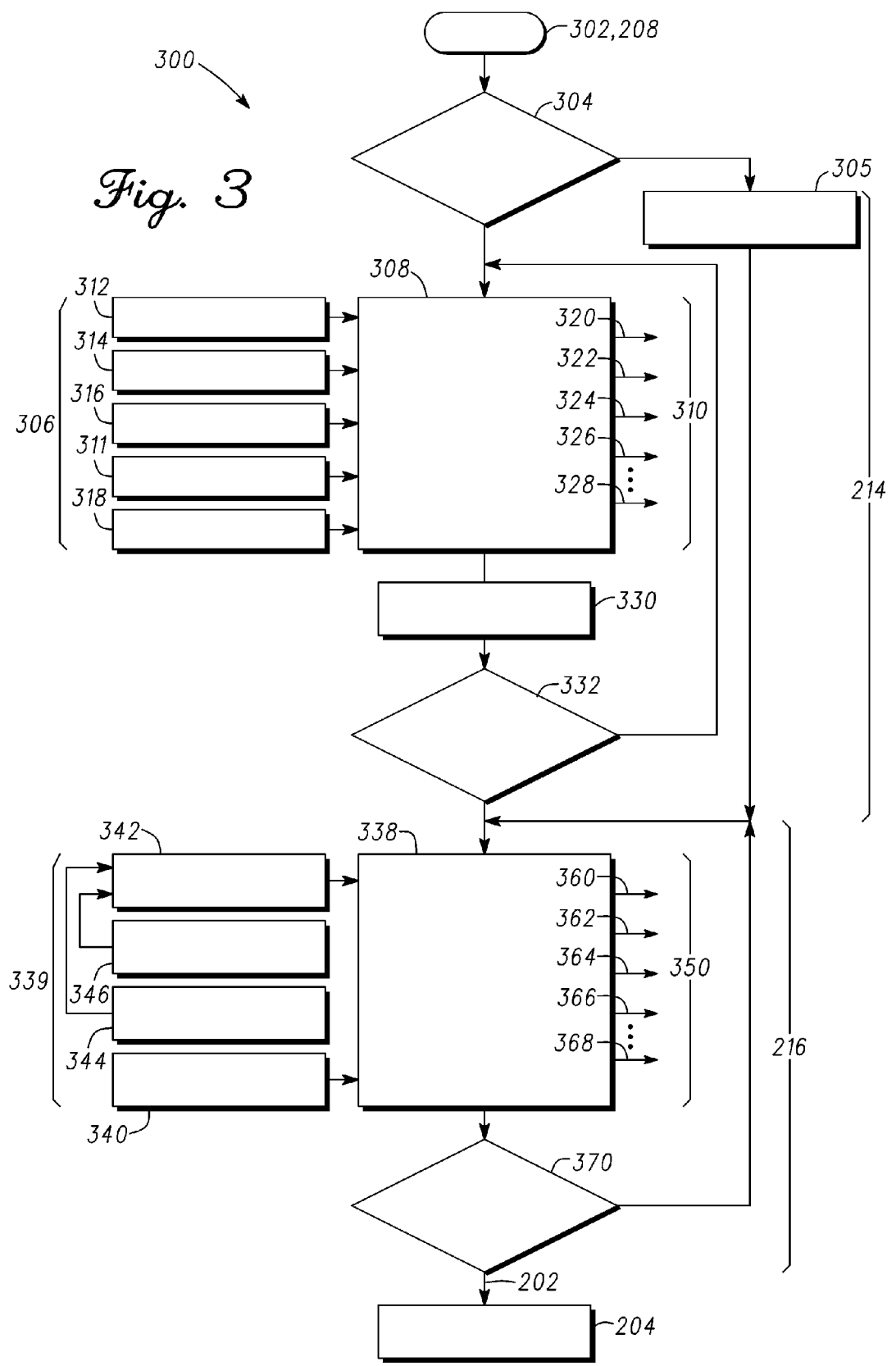
FIG. 3 is a flowchart of process for determining a motor temperature of a vehicle that includes certain sub-processes of the process of FIG. 2, including sub-process for running a motor temperature model using a first time step to generate an initial motor temperature, running the sub-process using a sub-process and the initial motor temperature to generate a subsequent temperature, and storing the subsequent temperature for use in a future iteration of the process, and that can be used in connection with the system of FIG. 1, in accordance with an exemplary embodiment.

FIG. 3 is a flowchart of a process 300 for determining temperatures for a motor of a vehicle, in accordance with an exemplary embodiment. The process 300 includes various steps or sub-processes of the process 200 of FIG. 2, including the step of determining that the ignition is turned off (step 202), the step of determining that the ignition is turned on (step 204), the step of storing motor temperature values for use in subsequent iterations (step 204), a sub-process of running the motor temperature model for the first sequence of iterations (corresponding to step 214), a sub-process of running the motor temperature model for the additional sequence of iterations (corresponding to step 216), The process 300 can similarly be used in connection with the systems 100, 102 of FIG. 1 in an exemplary embodiment.

As depicted in FIG. 3, the process 300 starts after the ignition of the vehicle has been turned on (step 302). The ignition preferably corresponds to the ignition 108 of FIG. 1. This determination is preferably made by the controller 120 of FIG. 1, most preferably by the processor 122 thereof, based on signals or information provided thereto by the ignition sensor 118 of FIG. 1. Step 302 of FIG. 3 preferably corresponds to step 208 of FIG. 2.

A determination is then made as to whether an amount of time that the ignition has been turned off exceeds a predetermined threshold (step 304). The predetermined threshold of step 304 comprises a predetermined amount of time such that, if the ignition is not turned off for at least this predetermined amount of time, the motor temperature is not likely to have cooled enough to approach the motor coolant temperature. In one embodiment, the predetermined threshold of step 304 is calculated by multiplying a constant factor (k) by a time constant ($\tau$). The constant (k) preferably varies between three (3) to five (5), and the time constant (t) preferably varies between 10 to 60 minutes (which is motor specific in a preferred embodiment). The predetermined threshold and/or the respective constant factor (k) and time constant ($\tau$), are preferably stored in the memory 124 of FIG. 1 as stored values 134 of FIG. 1. The determination of step 304 is preferably made by the controller 120 of FIG. 1, most preferably by the processor 122 thereof, using the amount of time of step 210 of FIG. 2 and the predetermined threshold.

If it is determined in step 304 that the amount of time that the ignition has been turned off exceeds the predetermined threshold, then the motor temperature is assumed to have converged to the motor coolant temperature. The motor coolant temperature of is then measured (step 305), preferably by the motor coolant temperature sensor 116 of FIG. 1, for subsequent use as an initial temperature condition for the motor. The process then proceeds directly to the sup-process 216 of FIG. 2, beginning with step 338, described further below.

Conversely, if it is determined in step 304 that the amount of time that the ignition has been turned off is less than or equal to the predetermined threshold, then the motor temperature is assumed to have not converged to the motor coolant temperature. The process then proceeds instead to step 308, as the motor temperature model is used to generate an initial motor temperature condition.

During step 308, the motor temperature model 136 of FIG. 1 is preferably retrieved form the memory 124 of FIG. 1 by the processor 122 of FIG. 1 and run for a first sequence of iterations, as referenced in step 214 of FIG. 2. Specifically, various inputs 306 are provided to the motor temperature model to generate various temperature values 310 for the motor. Specifically, each temperature value 310 corresponds to a different node of the motor.

Figure 4:
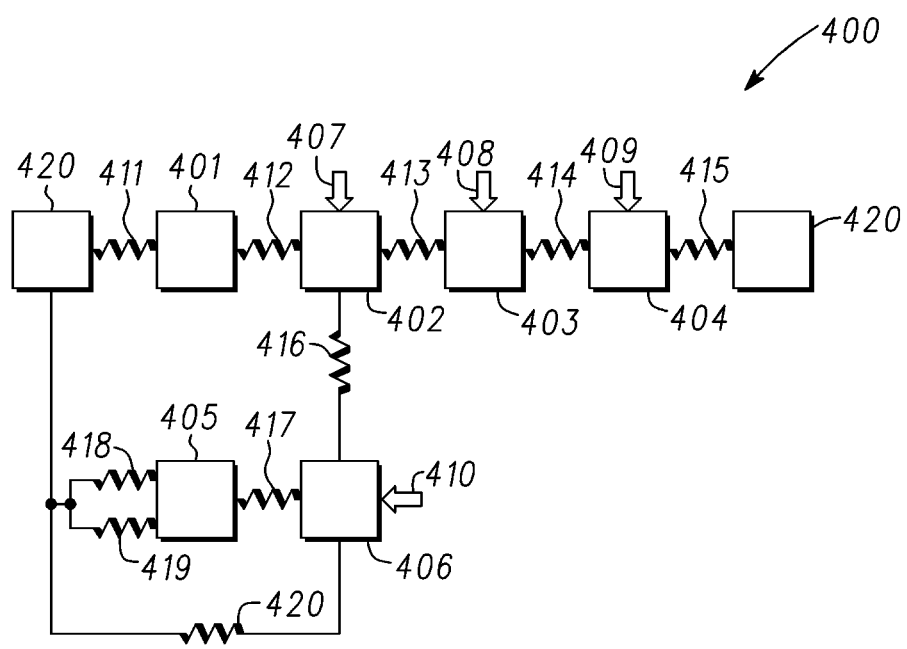
FIG. 4 provides a block diagram of an exemplary motor temperature model used in the process of FIGS. 2 and 3, in accordance with an exemplary embodiment.

Turning now to FIG. 4, a block diagram is provided with respect to one exemplary motor temperature model that can be utilized for the processes 200, 300 of FIGS. 2 and 3. In the embodiment of FIG. 4, the motor temperature model uses a thermal network-based approach to estimate motor temperature at various strategic locations/regions of the motor. Inputs to the motor temperature model preferably include motor coolant (oil) temperature and power dissipation loss. The motor temperature model utilizes a combination of analytically calculated values and empirically determined heat transfer coefficients.

Specifically, as depicted in FIG. 4, the motor temperature model measures motor temperatures at first, second, third, fourth, fifth, and sixth nodes 401, 402, 403, 404, 405, and 406, respectively, of the motor (depicted in FIG. 4 with respect to a motor coolant (oil) temperature, $T_{oil}$ 420). The first node 401 includes a non-flux producing portion of a stator stack of the motor. The second node 402 includes a flux producing portion of the stator stack. The third node 403 includes a copper metal disposed in a slot in the stator stack. The fourth node 404 includes a copper metal disposed in one or more end turns of the motor. The fifth node 405 includes a non-flux producing portion of the rotor core. The sixth node 406 includes a flux producing portion of the rotor core. The second node 402 is assigned with a stator iron loss 407. The third node 403 is assigned with a copper loss 408 in the slot. The fourth node 404 is assigned with a copper loss 409 in the end turn. The sixth node 406 is assigned with a rotor iron loss 410.

The various motor temperatures are calculated using various thermal resistance values depicted in FIG. 4. A first thermal resistance 411 represents convective external heat transfer path between the motor coolant and the stator core. A second thermal resistance 412 represents conductive heat transfer path through the stator stack. A third thermal resistance 413 represents conductive heat transfer path between the stator stack and the copper windings in the motor slot. A fourth thermal resistance 414 represents conductive heat transfer path between the motor slot copper windings and the end-turn copper windings. A fifth thermal resistance 415 represents convective heat transfer path between the motor coolant and the end-turn copper windings. A sixth thermal resistance 416 represents convective heat transfer path through an air gap of the motor. A seventh thermal resistance 417 represents conductive heat transfer path through the rotor core. An eighth thermal resistance 418 represents convective heat transfer path between the motor coolant (oil) and a hub of the motor. A ninth thermal resistance 419 and a tenth thermal resistance 420 both represent convective heat transfer paths between the motor coolant (oil) and an end ring of the rotor.

The motor temperature model utilizes the heat transfer coefficients and power dissipation loss calculations, along with the motor geometry, as inputs in creating a system of differential equations for each node 401-406. The system of differential equations is solved, to thereby generate a temperature change at each node for a given time step. The temperature change for each node is added to the current or most recent temperature for that node from a most recent prior iteration. Once the running of the motor temperature model is complete, a current temperature is determined for each node of the motor.

With reference again to FIG. 3, during step 308, in the depicted embodiment, the inputs 306 for the motor temperature model include a time step 311 that is configured to simulate the amount of time of step 210 of FIG. 2 for which the ignition had been turned off before most recently being turned on. A larger time step 311 is used for the first sequence of iterations of the motor temperature model of step 308 as compared with standard or typical operation of the motor temperature model. The time step 311 increases as the amount of time of step 210 of FIG. 2 increases.

The inputs 306 also preferably include various thermal heat transfer coefficients 312 at a zero cooling flow of motor fluid, an ambient temperature 314 (preferably corresponding to the ambient temperature of step 212 of FIG. 2), a torque/current/speed setting 316 in which each of the torque, the current, and the speed of the motor are set equal to zero, and the last saved motor temperature values 218 from the previous time period in which the ignition was on (preferably corresponding to the temperature values of step 204 of FIG. 2 for a prior iteration of the process).

During step 308, motor temperature values are generated for various nodes of the motor, thereby resulting in a first temperature value 320 for a first node (such as the first node 401 in FIG. 4), a second temperature value 322 for a second (such as the second node 402 in FIG. 4), a third temperature value 324 for a third node (such as the third node 403 in FIG. 4), a fourth temperature value 326 for a fourth node (such as the fourth node 404 in FIG. 4), and so on for "n" nodes, including an "nth" temperature value 328 for the "nth" node (such as the sixth node 406 in FIG. 4). The number of nodes may vary in different embodiments.

During each iteration of step 308, each preliminary temperature value 310 of the most recent previous iteration is added to a temperature change value generated by the motor temperature model to thereby generate the subsequent preliminary temperature value 310 of the current iteration (step 330). Steps 330 and 332 repeat in this manner for various iterations until it is determined that the simulated amount of elapsed time for the motor temperature model (given the time step 311) is equal to the amount of time of step 210 of FIG. 2 for which the ignition had been turned off (step 332). The most recent temperature values 310 from the most recent of the first sequence of iterations of the motor temperature model of step 308 are then utilized as the initial motor temperature conditions for use in the subsequent, additional sequence of iterations of the motor temperature model of sub-step 216 of FIG. 2, beginning with step 338 described below.

During step 338, the same motor temperature model is used to generate subsequent and more accurate determinations of present or current values of the temperature of the motor at various node of the motor. During step 338, the motor temperature model 136 of FIG. 1 is preferably run for an additional sequence of iterations. Specifically, various inputs 339 are provided to the motor temperature model to generate various temperature values 350 at different nodes of the motor. In the depicted embodiment, the inputs 339 include a second time step 340 and a set of initial conditions 342 for temperature estimation. The second time step 340 is preferably smaller than the first time 311 used in step 308. The time step for the first sequence of iteration may be as large as, but not limited to, five seconds (5 sec), while the time step for the second sequence of iteration is approximately 12.5 milliseconds (msec) in one exemplary embodiment. However, this may vary in other embodiments.

The initial conditions 342 utilized in step 338 depend upon the determination of step 304 described above. Specifically, if it was determined in step 304 that the amount of time that the ignition has been turned off exceeds a predetermined threshold, then a first set 344 of initial conditions 342 is utilized for the motor temperature model in step 338. The first set 344 of initial conditions 342 comprises the motor coolant temperature of step 305.

Conversely, if it was determined in step 304 that the amount of time that the ignition has been turned off is less than or equal to the predetermined threshold, then a second set 346 of initial conditions 342 is utilized for the motor temperature model in step 338. The second set 346 of initial conditions 342 comprise the preliminary temperature values 310 from the most recent iteration of step 308.

During step 338, the motor temperature model generates updated temperature values 350 for each of the nodes of the motor. Specifically, during step 338, updated motor temperature values are generated for various nodes of the motor, thereby resulting in updated values of a first temperature value 360 for a first node (such as the first node 401 in FIG. 4), a second temperature value 362 for a second (such as the second node 402 in FIG. 4), a third temperature value 364 for a third node (such as the third node 403 in FIG. 4), a fourth temperature value 366 for a fourth node (such as the fourth node 404 in FIG. 4), and so on for "n" nodes, including an "nth" temperature value 368 for the "nth" node (such as the sixth node 406 in FIG. 4). The number of nodes may vary in different embodiments. During each iteration, each respective temperature value 350 of the most recent previous iteration is added to a temperature change value generated by the motor temperature model to thereby generate the subsequent respective temperature value 350 of the current iteration.

After each iteration of step 338, a determination is made as to whether the ignition is still turned on (step 370). This determination is preferably made by the processor 122 of FIG. 1. If it is determined in step 370 that the ignition is still turned on, then the process returns to step 338, and additional iterations of the motor temperature model are conducted in various iterations of step 338 until this is a determination in an iteration of step 370 that the ignition is turned off. Once a determination is made that the ignition is turned off (corresponding to step 202 of FIG. 2), the most recent motor temperatures from the most recent iteration of step 338 are stored in the memory 124 of FIG. 1 for use in a subsequent iteration of the process (step 204).

Accordingly, improved methods, program products, and systems are provided. The improved methods, program products, and systems provide for improved determination of motor temperature values for a vehicle. The methods, program products, and systems provide for potentially improved motor temperature estimates at various nodes of the motor, for example in cases in which the ignition had been turned off for only a short duration of time and/or the ambient temperature is relatively warm.

It will be appreciated that the disclosed methods and systems may vary from those depicted in the Figures and described herein. For example, the controller 120 of FIG. 1 may be disposed in whole or in part in any one or more of a number of different vehicle units, devices, and/or systems. In addition, it will be appreciated that certain steps of the processes 200, 300 (and/or sub-processes thereof and/or the motor temperature model used therein) may vary from those depicted in FIGS. 2-4 and/or described above in connection therewith. It will similarly be appreciated that certain steps of the processes 200, 300 and/or the sub-processes thereof may occur simultaneously or in a different order than that depicted in FIGS. 2 and 3 and/or described above in connection therewith. It will similarly be appreciated that the disclosed methods and systems may be implemented and/or utilized in connection with any number of different types of automobiles, sedans, sport utility vehicles, trucks, any of a number of other different types of vehicles.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

We claim:

1. A method for determining a temperature of a motor of a vehicle having an ignition when the ignition is turned on following a period of time in which the ignition had been turned off, the method comprising the steps of:
   determining an amount of time for which the vehicle had been turned off; and
   running a motor temperature model via a processor for a plurality of iterations that are spaced apart based on a time step to simulate the amount of time for which the vehicle had been turned off to determine an initial value of the temperature of the motor, wherein the time step is based upon the amount of time for which the vehicle had been turned off, and wherein the motor temperature is determined by numerically solving a plurality of differential equations in an iterative manner utilizing the time step.

2. The method of claim 1, wherein the time step is positively related to the amount of time.

3. The method of claim 1, further comprising the step of:
   measuring an ambient temperature surrounding the vehicle;
   wherein the step of running the motor temperature model comprises using the ambient temperature as an input to the motor temperature model.

4. The method of claim 1, further comprising the step of:
   obtaining a prior temperature of the motor during a prior period in which the ignition was turned on prior to the period of time in which the ignition had been turned off;
   wherein the step of running the motor temperature model comprises using the prior temperature of the motor as an input to the motor temperature model.

5. The method of claim 1, further comprising the step of:
   determining whether the amount of time is greater than a predetermined threshold, wherein the step of running the motor temperature model comprises running the motor temperature model for the plurality of iterations that are spaced apart based on the time step upon a further condition that the amount of time is less than or equal to the predetermined threshold.

6. The method of claim 5, wherein the motor is cooled by a motor coolant, and the method further comprises the steps of:
   measuring a temperature of the motor coolant; and
   setting the initial value of the temperature of the motor equal to the temperature of the motor coolant if the amount of time is greater than the predetermined threshold.

7. The method of claim 1, further comprising the step of:
   running the motor temperature model for a second plurality of iterations that are spaced apart based on a second time step, and using the initial value as an input to determine a subsequent value of the temperature of the motor.

8. A program product for determining a temperature of a motor of a vehicle having an ignition when the ignition is turned on following a period of time in which the ignition had been turned off, the program product comprising:
- a program configured to:
  - determine an amount of time for which the vehicle had been turned off; and
  - run a motor temperature model for a plurality of iterations that are spaced apart based on a time step to simulate the amount of time for which the vehicle had been turned off to determine an initial value of the temperature of the motor, wherein the time step is based upon the amount of time for which the vehicle had been turned off, and wherein the motor temperature is determined by numerically solving a plurality of differential equations in an iterative manner utilizing the time step; and
- a non-transitory, computer readable storage medium storing the program.

9. The program product of claim 8, wherein the time step is positively related to the amount of time.

10. The program product of claim 8, wherein the program is further configured to:
- measure an ambient temperature surrounding the vehicle; and
- run the motor temperature model for the plurality of iterations that are spaced apart based on the time step and using the ambient temperature as an input to the motor temperature model.

11. The program product of claim 8, wherein the program is further configured to:
- obtain a prior temperature of the motor during a prior period in which the ignition was turned on prior to the period of time in which the ignition had been turned off; and
- run the motor temperature model for the plurality of iterations that are spaced apart based on the time step and using the prior temperature of the motor as an input to the motor temperature model.

12. The program product of claim 8, wherein the program is further configured to:
- determine whether the amount of time is greater than a predetermined threshold; and
- run the motor temperature model for the plurality of iterations that are spaced apart based on the time step upon a further condition that the amount of time is less than or equal to the predetermined threshold.

13. The program product of claim 12, wherein the motor is cooled by a motor coolant, and the program is further configured to:
- measure a temperature of the motor coolant; and
- set the initial value of the temperature of the motor equal to the temperature of the motor coolant if the amount of time is greater than the predetermined threshold.

14. The program product of claim 8, wherein the program is further configured to run the motor temperature model for a second plurality of iterations that are spaced apart based on a second time step and the initial value as an input to determine a subsequent value of the temperature of the motor.

15. A system for determining a temperature of a motor of a vehicle having an ignition when the ignition is turned on following a period of time in which the ignition had been turned off, the system comprising:
- a memory configured to store an input; and
- a processor coupled to the memory, the processor configured to:
  - determine an amount of time for which the vehicle had been turned off; and
  - run a motor temperature model using the input for a plurality of iterations that are spaced apart based on a time step to simulate the amount of time for which the vehicle had been turned off to determine an initial value of the temperature of the motor, wherein the time step is based upon the amount of time for which the vehicle had been turned off, and wherein the motor temperature is determined by numerically solving a plurality of differential equations in an iterative manner utilizing the time step.

16. The system of claim 15, wherein the time step is positively related to the amount of time.

17. The system of claim 15, further comprising:
- a sensor configured to measure an ambient temperature surrounding the vehicle, wherein the input comprises the ambient temperature.

18. The system of claim 15, wherein the input comprises a prior temperature of the motor during a prior period in which the ignition was turned on prior to the period of time in which the ignition had been turned off.

19. The system of claim 15, wherein the processor is further configured to:
- determine whether the amount of time is greater than a predetermined threshold; and
- run the motor temperature model using the input for the plurality of iterations that are spaced apart based on the time step upon a further condition that the amount of time is less than or equal to the predetermined threshold.

20. The system of claim 19, wherein the motor is cooled by a motor coolant, and the system further comprises:
- a sensor configured to measure a temperature of the motor coolant, wherein the processor is further configured to set the initial value of the temperature of the motor equal to the temperature of the motor coolant if the amount of time is greater than the predetermined threshold.

* * * * *